(12) United States Patent
North

(10) Patent No.: US 11,480,394 B2
(45) Date of Patent: Oct. 25, 2022

(54) HEAT PIPES HAVING WICK STRUCTURES WITH VARIABLE PERMEABILITY

(71) Applicant: Aavid Thermal Corp., Wilmington, DE (US)

(72) Inventor: Mark T. North, Lancaster, PA (US)

(73) Assignee: Aavid Thermal Corp., Wilmington, DE (US)

( * ) Notice: Subject to any disclaimer, the term of this patent is extended or adjusted under 35 U.S.C. 154(b) by 0 days.

(21) Appl. No.: 17/260,390

(22) PCT Filed: Jul. 16, 2019

(86) PCT No.: PCT/US2019/041921
§ 371 (c)(1),
(2) Date: Jan. 14, 2021

(87) PCT Pub. No.: WO2020/018484
PCT Pub. Date: Jan. 23, 2020

(65) Prior Publication Data
US 2021/0262737 A1 Aug. 26, 2021

Related U.S. Application Data

(60) Provisional application No. 62/699,948, filed on Jul. 18, 2018.

(51) Int. Cl.
*F28D 15/04* (2006.01)

(52) U.S. Cl.
CPC .................................. *F28D 15/046* (2013.01)

(58) Field of Classification Search
CPC ... F28D 15/046; F28D 15/04; H05K 7/20336; H05K 7/2029; H01L 23/427
(Continued)

(56) References Cited

U.S. PATENT DOCUMENTS 3,754,594 A * 8/1973 Ferrell .................. F28D 15/046
165/272
4,489,777 A 12/1984 Del Bagno et al.
(Continued)

FOREIGN PATENT DOCUMENTS

WO 2005108897 A2 11/2005

OTHER PUBLICATIONS

North, "Optimization of Heat Pipe Thermal Transport Using Axially Graded Capillary Wick Structures," 2005 ASME International Mechanical Engineering Congress and Exposition, Nov. 5-11, 2005, IMECE2005-82950.
(Continued)

*Primary Examiner* — Tho V Duong
(74) *Attorney, Agent, or Firm* — Michael Best & Friedrich LLP

(57) ABSTRACT

A heat pipe is provided having a hollow body defining an interior vapor space, evaporator and condenser regions, a wick structure lining an inner wall of the hollow body, and a working fluid disposed in the hollow body, wherein a path for the working fluid in liquid state extends from the condenser region toward the evaporator region or wherein the wick structure extends along a direction from a first end of the hollow body toward the second end, and wherein the wick structure includes first and second regions that extend along the path or direction and that each have wick particles defining respective pore sizes that are different from one another.

27 Claims, 7 Drawing Sheets

(58) Field of Classification Search
USPC .................................................. 165/104.26
See application file for complete search history.

(56) References Cited

U.S. PATENT DOCUMENTS

| | | | | |
|---|---|---|---|---|
| 7,137,442 | B2* | 11/2006 | Kawahara | F28D 15/0233 165/104.21 |
| 9,752,832 | B2* | 9/2017 | Kare | F28D 15/04 |
| 2003/0141045 | A1 | 7/2003 | Oh et al. | |
| 2006/0283575 | A1* | 12/2006 | Pai | F28D 15/046 165/104.26 |
| 2007/0084587 | A1* | 4/2007 | Huang | F28D 15/046 165/104.26 |
| 2007/0193722 | A1 | 8/2007 | Hou et al. | |
| 2007/0193723 | A1* | 8/2007 | Hou | F28D 15/0233 165/146 |
| 2007/0246194 | A1 | 10/2007 | Hou et al. | |
| 2011/0024085 | A1* | 2/2011 | Huang | F28D 15/0233 29/890.032 |
| 2011/0214841 | A1 | 9/2011 | Huang et al. | |
| 2013/0092354 | A1 | 4/2013 | Semenov et al. | |
| 2014/0174086 | A1* | 6/2014 | Kare | F01K 11/02 60/670 |
| 2020/0008321 | A1* | 1/2020 | Marcoccia | H05K 7/20663 |

OTHER PUBLICATIONS

Zuo et al., "High Heat Flux Heat Pipe Mechanism for Cooling of Electronics," IEEE Transactions on Components and Packaging Technologies, Jun. 2001, 24(2):220-225.
Zuo et al., "Heat Pipe Vapor Chamber Cold Plate Modeling, Fabrication and Testing," Proceedings of the ASME, 1998, Heat Transfer Division vol. 3, HTD-vol. 361-3/PID-vol. 3, 281-286.
International Search Report and Written Opinion for Application No. PCT/US2019/041921 dated Oct. 3, 2019 (11 pages).
International Preliminary Report on Patentability for Application No. PCT/US2019/041921 dated Jan. 28, 2021 (11 pages).
Chinese Patent Office Action for application 201910650206.1, dated Jun. 15, 2022, 18 pages with translation.

* cited by examiner

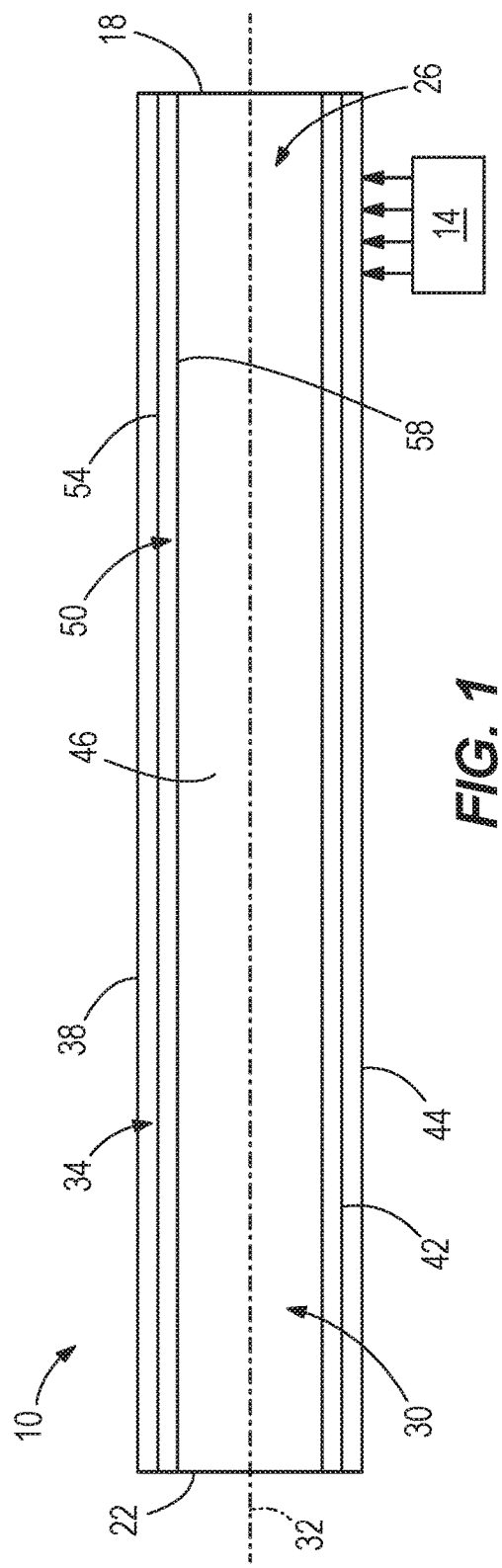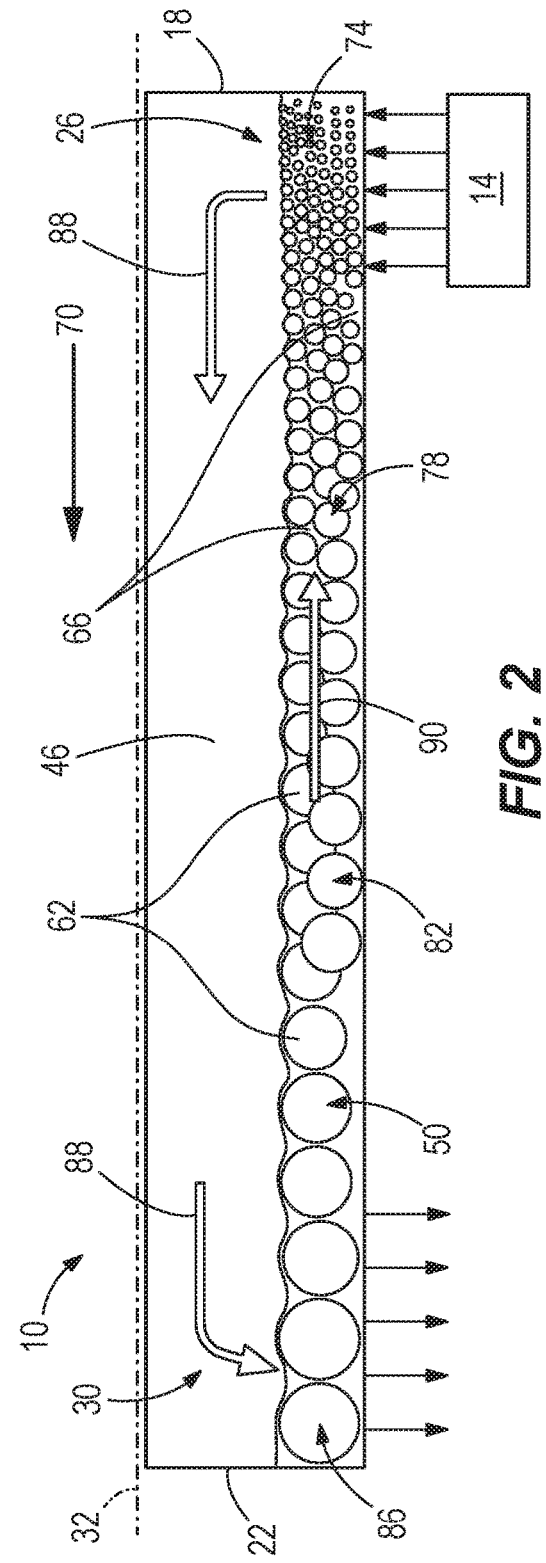

HEAT PIPES HAVING WICK STRUCTURES WITH VARIABLE PERMEABILITY

CROSS-REFERENCE TO RELATED APPLICATIONS

This application claims priority to U.S. Provisional Application No. 62/699,948, filed Jul. 18, 2018, the entire contents of which are incorporated herein by reference.

FIELD OF THE INVENTION

The present invention generally relates to heat transfer devices that rely upon capillary action as a transport mechanism and, more particularly, to heat pipes having wick structures that facilitate capillary action of working fluid within the heat pipes.

BACKGROUND

Heat pipes are often used to cool electronics devices. Heat pipes use evaporation and condensation cycles of working fluid to move heat from a heat source on the electronics device to a location spaced away from the heat source, and to quickly cool the electronics device. Heat pipes often include wick structures disposed within the heat pipes to facilitate the movement (e.g., capillary action) of working fluid within the heat pipes, particularly movement of the working fluid from condenser ends of the heat pipes to evaporator ends of the heat pipes. Current wick structures are typically uniform in nature, meaning that the size of particles and/or pores in the wick structures does not vary within the wick structures.

SUMMARY

In some embodiments, a heat pipe is provided, and includes a first end and a second opposite end, wherein the first end defines an evaporator region and the second end defines a condenser region, wherein the heat pipe includes an inner wall that extends from the first end to the second end; and a wick structure disposed adjacent the inner wall and extending along a direction from the first end toward the second end, the wick structure including a first region that extends along the direction, the first wick structure region having wick particles defining a first pore size, the wick structure including a second region that extends from the first wick structure region along the direction, the second wick structure region having wick particles defining a second pore size that is different from the first pore size.

Some embodiments of the present invention provide a heat pipe including a hollow body defining an interior vapor space, the hollow body having an evaporator region, a condenser region, and an intermediate region disposed between the evaporator region and the condenser region along a length of the hollow body; a wick structure coupled to an inner wall of the hollow body; and a working fluid disposed within the hollow body, wherein when heat is applied to the working fluid at the evaporator region the working fluid is configured to evaporate into a vapor state, pass through the interior vapor space in the vapor state, condense back to a liquid state from the vapor state at the condenser region, and return from the condenser region to the evaporator region through the wick structure in the liquid state, such that along the intermediate region the condensed liquid working fluid moves in a direction through the wick structure; wherein the wick structure includes a first region having a length along the first direction and having wick particles defining a first pore size, and wherein the wick structure includes a second region having a length along the first direction, the second wick structure region extending from the first wick structure region along the first direction, the second wick structure region having wick particles defining a second pore size that is different from the first pore size.

In some embodiments, a heat pipe is provided, and includes an elongate hollow tube defining a vapor space therein, the elongate hollow tube having a first end defining an evaporator region, a second opposite end defining a condenser region, and an inner wall extending from the first end to the second end; and a wick structure disposed adjacent the inner wall, the wick structure including a plurality of regions, wherein each wick structure region of the plurality of wick structure regions has wick particles defining a pore size that is different from the pore size defined by the wick particles in each of the other wick structure regions, a first wick structure region of the plurality of wick structure regions is adapted for heat input at the evaporator region, a second wick structure region of the plurality of wick structure regions is adapted for heat discharge at the condenser region, and the first wick structure region has pores of a first pore size and the second wick structure region has pores of a second pore size that is larger than the first particle size.

Some embodiments of the present invention provide a heat pipe including a first end and a second opposite end, wherein the first end defines an evaporator region and the second end defines a condenser region, wherein the heat pipe includes an inner wall that extends from the first end to the second end; and a wick structure disposed adjacent the inner wall and extending along a direction from the first end toward the second end, the wick structure including a first region that extends along the direction, the first wick structure region having a first permeability, the wick structure including a second region that extends from the first wick structure region along the direction, the second wick structure region having a second permeability that is different from the first permeability.

In some embodiments, a heat pipe is provided, and includes a hollow body defining an interior vapor space, the hollow body having an evaporator region and a condenser region; a working fluid disposed within the hollow body; and a wick structure lining an inner wall of the hollow body and defining a path for the working fluid in liquid state from the condenser region toward the evaporator region, wherein the wick structure includes a first region that extends along the path, the first wick structure region having wick particles defining a first pore size, the wick structure including a second region that extends from the first wick structure region along the path, the second wick structure region having wick particles defining a second pore size that is different from the first pore size.

Other aspects of the present invention will become apparent by consideration of the detailed description and accompanying drawings.

BRIEF DESCRIPTION OF THE DRAWINGS

FIG. 1 is a schematic illustration of a heat pipe according to one embodiment.

FIG. 2 is a schematic illustration of a portion of the heat pipe, illustrating a wick structure having regions of particles, each region having particles that vary in size within the region.

DETAILED DESCRIPTION

Figure 3:
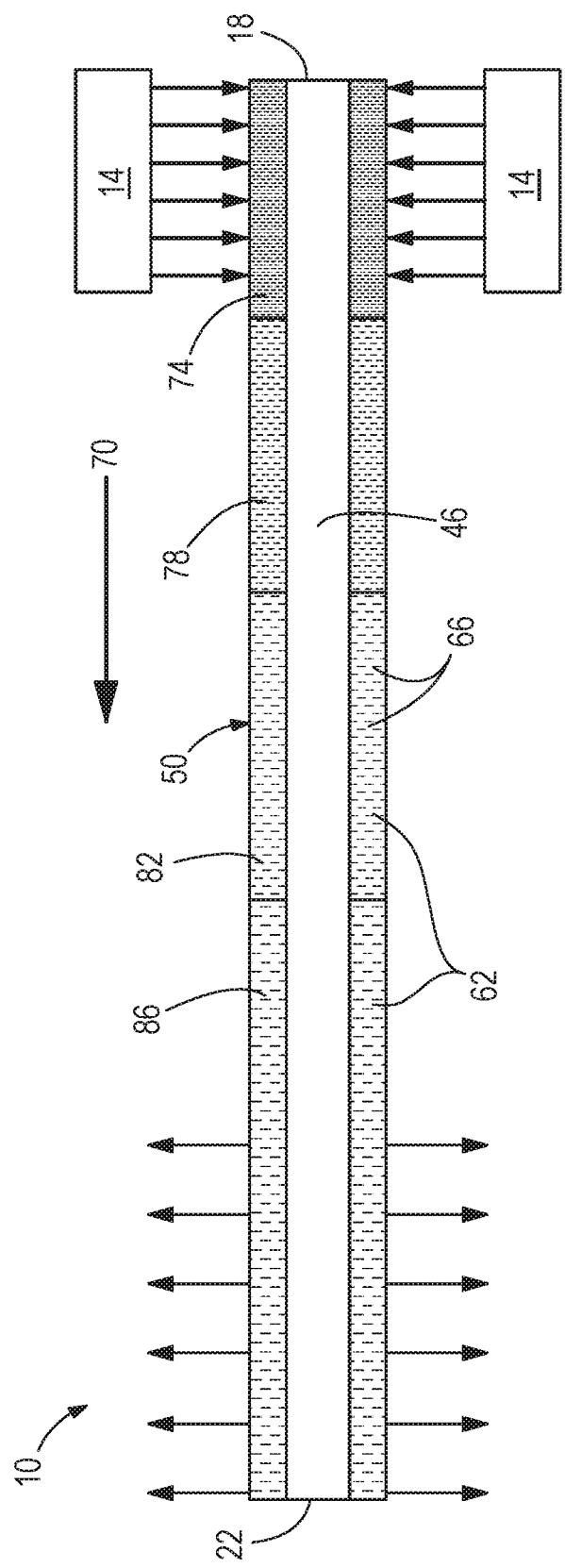
FIG. 3 is a schematic illustration of another embodiment of the heat pipe, illustrating a wick structure having regions of particles, each region having particles of the same size.

Before any embodiments of the present invention are explained in detail, it is to be understood that the invention is not limited in its application to the details of construction and the arrangement of components set forth in the following description or illustrated in the accompanying drawings. The present invention is capable of other constructions and of being practiced or of being carried out in various ways. Also, it is to be understood that the phraseology and terminology used herein is for the purpose of description and should not be regarded as limited.

FIG. 1 illustrates a heat pipe 10. The heat pipe 10 is sized and shaped to transfer and/or spread thermal energy generated by at least one heat source 14 (e.g., a semiconductor device or other electronic component). The heat pipe 10 includes a first end 18 and a second, opposite end 22. The first end 18 defines an evaporator region 26, and the second end 22 defines a condenser region 30. The heat pipe 10 may take a variety of shapes and forms. For example, in some embodiments the heat pipe 10 may be a single elongate axial tube. In other embodiments the heat pipe 10 may include at least one curve or bend. In some embodiments the heat pipe 10 is a loop heat pipe, or a thermosiphon, or is a variable conductance heat pipe. Alternatively, the heat pipe 10 can have a substantially flat profile (e.g., having length and width dimensions that are substantially larger than the thickness of the heat pipe 10), in which case the evaporator and condenser regions 26, 30 can instead be defined by the opposite substantially flat sides of the heat pipe 10. Other embodiments include various shapes and sizes than that illustrated for the heat pipe 10.

In the illustrated embodiment of FIG. 1, the heat pipe 10 is a sealed, hollow, and generally elongate tubular structure that extends along an axis 32. The illustrated heat pipe 10 includes a main body 34 at least partially defined by a wall 38 with an inner surface 42 that faces radially inwardly toward an interior vapor space 46, and an outer surface 44 that faces radially outwardly toward an outside environment. The main body 34 may be formed at least partially of metal, including without limitation copper, aluminum, stainless steel, steel, magnesium, titanium, any alloy of such metals, a superalloy, other suitable materials (e.g., other solid thermal conducting materials), or any combination thereof.

With continued reference to FIG. 1, the heat pipe 10 includes a wick structure 50 that is coupled to or otherwise lines the inner surface 42 of the wall 38 along at least a portion of the main body 34, and is used to move condensed working fluid (e.g., water, refrigerant, methanol, ammonia, cesium, potassium, sodium, nitrogen, neon, hydrogen, helium, or any other suitable working fluid, and any combination thereof) within the heat pipe 10. The wick structure 50 has an outer wick structure surface 54 that faces radially outwardly and in some embodiments is contact with the inner surface 42 of the main body 38, and an inner wick structure surface 58 that faces radially inwardly toward the vapor space 46. In the illustrated embodiment, the wick structure 50 is formed of copper powder, although other embodiments include different wick materials (e.g., gold, aluminum, and the like) or combinations thereof. The wick structure 50 may additionally or alternatively include one or more grooves (e.g., extending parallel to the axis 32), and/or include a screen or mesh structure to facilitate movement of condensed working fluid within the heat pipe 10.

With reference to FIGS. 2 and 3, which illustrate two alternative embodiments of the wick structure 50, at least a portion of the wick structure 50 includes particles 62 (e.g., particles of copper powder) that can be sintered, fused, brazed, or otherwise held together, forming pores 66 (e.g., openings or gaps) within the wick structure 50. The particles 62 may be spherical, oblate, dendritic, irregular, or can have other shapes. The wick structure 50 includes two or more wick structure regions having particles 62 of different size (e.g., different diameter). Accordingly, the wick structure 50 includes two or more wick structure regions having pores 66 of different size. For example, and as illustrated in FIG. 2, the heat pipe 10 extends along a direction 70 from the first end 18 to the second end 22 to define a fluid pathway extending along the direction. In the illustrated embodiment, the direction 70 extends linearly directly from the first end 18 to the second end 22, although in embodiments where the heat pipe 10 has a curvature or bend(s), the direction 70 will follow the heat pipe curvature or bend from the first end 18 to the second end 22. In other embodiments, the heat pipe 10 extends along (i.e., is elongated in) one or more other directions which may or may not correspond to the direction working fluid moves between the evaporator and condenser regions 26, 30. Regardless of the shape of the heat pipe 10, working fluid in the heat pipe travels along a working fluid pathway, which includes the pathway taken by working fluid in liquid form as it moves in the heat pipe 10 from the condenser region 30 toward the evaporator region 26, and/or the pathway taken by working fluid in vapor form as it moves in the heat pipe 10 from the evaporator region 26 toward the condenser region 30.

In the illustrated embodiments of FIGS. 2 and 3, the wick structure 50 includes a first wick structure region 74 at the first end 14 and evaporator region 26, a second wick structure region 78 extending from the first region 74 along the direction 70, a third wick structure region 82 extending from the second region 78 along the direction 70, and a fourth wick structure region 86 extending from the third region 82 along the direction, such that the second region 78 is disposed between the first and third regions 74, 82 along the direction 70, and the third region 82 is disposed between the second and fourth regions 78, 86 along the direction. The fourth region 86 of the illustrated embodiments of FIGS. 2 and 3 is disposed at the second end 22 and the condenser region 30. The wick structure 50 may extend along the direction 70 continuously from the evaporator region 26 to the condenser region 30, may extend only partially between the evaporator region 26 and the condenser region 30, or may be subdivided into various wick structures 50 between the evaporator region 26 and the condenser region 30.

The wick structure 50 varies in particle size, and therefore in pore size. For example, as illustrated in FIG. 2, the first region 74 includes particles 62 of a smaller average particle size than the particles 62 in the second region 78, the second region 78 includes particles of a smaller average particle size than the particles 62 in the third region 82, and the third region 82 includes particles 62 of a smaller average particle size than the particles 62 in the fourth region 86. As used herein and in the appended claims, the terms "particle size" (and facsimiles thereof) may correspond, for example, to a diameter of a particle 62, and/or an overall volume of a particle 62. Similarly, as used herein and in the appended claims, the term "pore size" (and facsimiles thereof) may correspond, for example, to an overall volume of a pore 62. Also, in some embodiments a given region of the wick structure has a "particle size" or "pore size", which is understood to include particles and pores that are all substantially the same size in the region, and in those embodiments where a combination of particle and pore sizes exist in the region, the average size of the particles or pores in that region.

In those embodiments in which the wick structure 50 is defined by elements that are not considered "particles" and/or by voids that are not considered "pores", the wick structure variability can be expressed in other manners. Specifically, the wick structure 50 has a fluid permeability that varies in different regions of the wick structure 50. With reference to the illustrated embodiments of FIGS. 2 and 3, the permeability of regions 74, 78, 82, 86 increases from the first region 74 to the fourth region 86.

With continued reference to the illustrated embodiments of FIGS. 2 and 3, moving along the direction 70 from the evaporator region 26 to the condenser region 30, the particle size of the particles 62 (and therefore the fluid permeability of the wick structure 50) increases. In the illustrated embodiments of FIG. 2, the particle size (and therefore fluid permeability) also increases within the regions 74, 78, 82, 86 themselves, such that there is a generally continuous change in particle size moving along the direction 70.

As illustrated in FIG. 2, during operation, working fluid within the heat pipe 10 is heated and evaporated at the evaporator region 26. The working fluid moves through the vapor space 46, and condenses at the condenser region 30, as illustrated by the arrows 88. The condensed working fluid then travels back through the wick structure 50 sequentially from the fourth wick structure region 86 to the third wick structure region 82, to the second wick structure region 78, and finally to the first wick structure region 74, as illustrated by the arrow 90.

Figure 4:
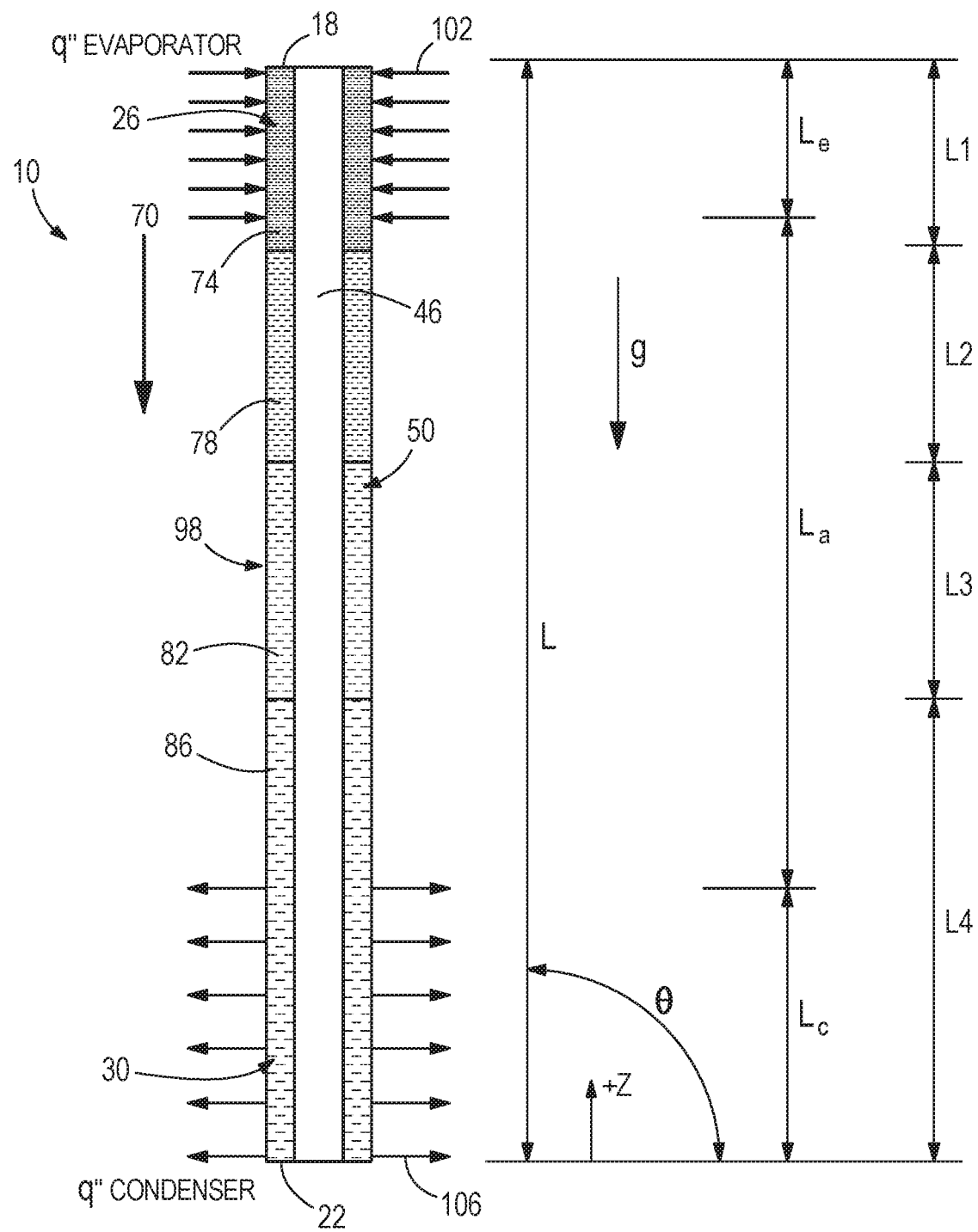
FIG. 4 is a schematic illustration of the heat pipe of FIG. 3, oriented vertically.
Figure 5:
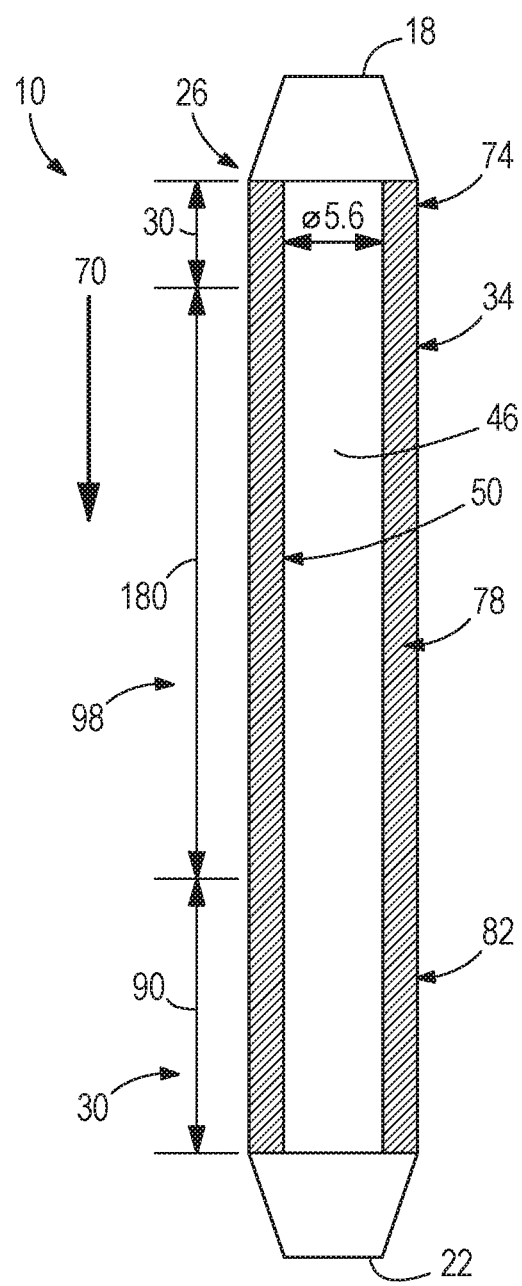
FIG. 5 is a schematic illustration of another embodiment of the heat pipe, having specific dimensions and a uniform thickness.

With reference to FIGS. 3 and 4, in other embodiments the first region 74 has particles that are all (or substantially all) of a first particle size, the second region 78 has particles that are all (or substantially all) of a second particle size, the third region 82 has particles that are all (or substantially all) of a third particle size, and the fourth region 86 has particles that are all (or substantially all) of a fourth particle size. In the illustrated embodiments of FIGS. 3 and 4 the first particle size is smaller than the second particle size, the second particle size is smaller than the third particle size, and the third particle size is smaller than the fourth particle size. The pore sizes in first, second, third, and fourth regions 74, 78, 82, 86 increase from the first region 74 to the fourth region 86. Although the embodiments of FIGS. 3 and 4 each have four regions 74, 78, 82, 86), in other embodiments the wick structure 50 has as few as two or three regions, or more than four regions, each region having an increasing particle size, pore size, and/or fluid permeability from the evaporator region 26 to the condenser region 30 as disclosed herein.

The particle sizes and ratios of particle sizes (e.g., diameter or volumetric sizes) may vary within the heat pipe 10. For example, a ratio of particle sizes in different wick structure regions 74, 78, 82, and/or 86 (e.g., the second particle size to first particle size, the third particle size to the second particle size, and/or the fourth particle size to the third particle size) may be at least 1.5:1, at least 2:1, at least 3:1, or other values. Alternatively or in addition, the pore sizes and ratios of pore sizes may vary within the heat pipe 10. For example, a ratio of pore sizes in different wick structure regions 74, 78, 82, and/or 86 (e.g., the second pore size to first pore size, the third pore size to the second pore size, and/or the fourth pore size to the third pore size) may be at least 1.5:1, at least 2:1, at least 3:1, or other values. In some embodiments, the fluid permeability of the of the wick structure 50 may vary within the heat pipe 10. For example, a ratio of the fluid permeability of different wick structure regions 74, 78, 82, and/or 86 (e.g., fluid permeability of the second region 78 to that of the first region 74, the fluid permeability of the third region 82 to that of the second region 76, and/or the fluid permeability of the fourth region 86 to that of the third region 82) may be at least 1.5:1, at least 2:1, at least 3:1, or other values. The wick structure regions disclosed herein (e.g., regions 74, 78, 82, 86 in the illustrated embodiments of FIGS. 2 and 3) are illustrated as being immediately adjacent with one another (e.g., in contact with one another). However, such a relationship between the regions is not required. In alternative embodiments, the wick structure regions can be separated, such as by regions of the heat pipe 10 not having a wick structure or by a wick structure region having different properties.

In some embodiments, the first region 74 is formed by depositing (e.g., manually or via a machine) a plurality of particles 62 of the first particle size (e.g., a standard size) into a hollow interior of the heat pipe 10 (e.g., into a gap between a mandrel disposed within the hollow interior and the wall 38). The particles 62 of the first particle size can then be pressed or otherwise compacted together along an axial direction of the heat pipe 10. Particles 62 of the second size (e.g., a different standard size) are then deposited into the hollow interior (e.g., into the gap between the mandrel and wall 38) and can be pressed or otherwise compacted together axially, forming the second region 78. Particles 62 of the third particle size (e.g., a different standard size) are then deposited into the hollow interior (e.g., into the gap between the mandrel and the wall 38) and can be pressed or otherwise compacted together axially, forming the third region 82. Particles 62 of the fourth particle size (e.g., a different standard size) are then deposited into the hollow interior (e.g., into the gap between the mandrel and the wall 38) and can be pressed or otherwise compacted together axially, forming the fourth region 86. This process can be performed any number of times to define two, three, or more wick structure regions of the heat pipe 10 as disclosed herein.

The particles 62 can then be sintered, fused, brazed, or are otherwise bonded together. Depending at least in part upon the manner in which the wick is formed, the mandrel (if used) can be removed before or after this wick formation step. The wick structure 50 is left behind in the heat pipe 10, extending along the wall 38 and the vapor space 46. Other embodiments include different methods of forming the various regions of particles 62. Additionally, and as discussed above, while four different regions 74, 78, 82, 86 are illustrated in FIGS. 2 and 3, in other embodiments the heat pipe 10 may include only two regions, three regions, or may include more than four regions (e.g., five, six, etc.).

In some embodiments, the wick structures 50 are tested (e.g., for dry-out) after they have been created, to detect performance. Based upon the tested performance, part or all of the wick structure 50 may be removed and replaced by wick structure region(s) having different particle sizes, pore sizes, and/or fluid permeabilities to create a new wick structure 50.

The wick structure 50 generates a capillary action that pumps condensed working fluid within the heat pipe 10 from the condenser region 30 to the evaporator region 26. In some embodiments, the smaller size of the particles 62 or pore size in the region proximate the evaporator region 26 (e.g., the first wick structure region 74 in the illustrated embodiments of FIGS. 2 and 3) provides for larger capillary pumping, while the larger size of the particles 62 or pore size in the region proximate the condenser region 30 (e.g., the fourth wick structure region 86 in the illustrated embodiments of FIGS. 2 and 3) provides for higher permeability and reduces liquid flow resistance. In those embodiments having three or more regions, such as wick structure regions corresponding to the evaporator and condenser regions 26, 30 and one or more additional intermediate wick structure regions, greater control of capillary pumping along the wick structure 50 is provided, particularly in light of the characteristics (e.g., temperature, fluid pressure, and the like) of the working fluid at different locations along the wick structure 50. This control can increase the efficiency and pumping capacity of the wick structure 50, and in some cases can be tailored to particular applications or anticipated operating conditions of the heat pipe 10.

The use of two or more wick structure regions having particle sizes, pore sizes, and/or permeability that increases from the evaporator region 26 to the condenser region 30 can facilitate a more efficient pumping action than a wick structure 50 having a uniform particle size throughout. For example, the larger particle size (and pore size) at the condenser region 30 can allow for evaporated working fluid to quickly pass into the wick structure 50 and move back toward the evaporator region 26. Conversely, the increasingly smaller particle size (and pore size) moving along the heat pipe 10 toward the evaporator region 26 can facilitate a greater pumping action as liquid travels away from cooler areas of the heat pipe 10 proximate the condenser region 30 toward warmer areas of the heat pipe 10 proximate the evaporator region 26—and as liquid nearer the evaporator region 26 evaporates and escapes the smaller particle/smaller pore wick structure proximate that region. Thus, working fluid naturally accumulates and flows toward the evaporator region 26, where it is held and heated by at least one heat source 14.

The capillary action of the wick structure 50 may be aided by gravity. For example, and with reference to FIG. 4, in some embodiments the evaporator region 26 is disposed at a higher elevation (e.g., above) the condenser region 30 (i.e., with an angle $\Theta$ being 90 degrees in the illustrated embodiment, by way of example). In such embodiments, during operation the condensed working fluid travels upwards, vertically, through the wick structure 50 back to the evaporator region 26, against the force of gravity. In other embodiments, the evaporator region 26 is disposed at a lower elevation (e.g., below) the condenser region 30, and the force of gravity aids in moving the condensed working fluid back to the evaporator region 26. In still other embodiments, and as illustrated in FIGS. 1-3, the evaporator region 26 and the condenser region 30 may be generally spaced from one another horizontally, such that the force of gravity is not a substantial factor (or a factor at all) in the movement of condensed working fluid from the condenser region 30 back to the evaporator region 26. Other embodiments include various other orientations of the heat pipe 10 (e.g., various values for the angle $\Theta$).

The lengths of the wick structure regions along the direction of the heat pipe 10 (or along the path followed by working fluid between the evaporator and condenser regions 26, 30) can vary. With reference to the illustrated embodiment of FIG. 4 and a four-region wick structure 50 by way of example only, the lengths of the first, second, third, and fourth regions 74, 78, 82, 86 as measured along the direction 70 may vary. For example, the first region 74 may have a first length L1, the second region may have a second length L2, the third region may have a third length L3, and the fourth region may have a length L4. Such lengths can be measured in a direction along the length of a straight heat pipe as shown in the illustrated embodiments. An alternative manner of expressing these lengths which applies to these and other embodiments is measurement of region lengths of the wick structure 50 along which working fluid moves from the condenser region 30 to the evaporator region 26 during operation of the heat pipe 10. In some embodiments, the first length L1 is smaller than the second length L2, the second length L2 is smaller than the third length L3, and/or the third length L3 is smaller than the fourth length L4. In some embodiments, the ratio of the second length L2 to the first length L1 is at least 1.5:1, at least 2:1, at least 3:1, or other values. Similarly, in some embodiments the ratio of the third length L3 to the second length L2 is at least 1:5:1, at least 2:1, at least 3:1 or other values, whereas in some embodiments the ratio of the fourth length L3 to the third length L2 is at least 1:5:1, at least 2:1, at least 3:1 or other values.

In some embodiments, the length of the first wick structure region 74 (i.e., having a first particle size, pore size, and/or fluid permeability, and located proximate the evaporator region 26 of the heat pipe 10) is no greater than 50% of the total length of the wick structure 50 (i.e., including the remainder of the wick structure 50 extending away from the first wick structure region 74 and having different particle size, pore size, and/or fluid permeability than the wick in the first wick structure region 74. In other embodiments, the first wick structure region 74 is no greater than 40% of the total length of the wick structure. In still other embodiments, the first wick structure region 74 is no greater than 30% of the total length of the wick structure.

With reference again to the illustrated embodiment of FIG. 4 (and a four-region wick structure 50 by way of example only), in some embodiments the first length L1 is larger than the second length L2, the second length L2 is larger than the third length L3, and/or the third length L3 is larger than the fourth length L4. Other embodiments include various other configurations. For example, in some embodiments the second length L2 may be smaller than both the first length L1 and the third length L2, or the third length L3 may be smaller than both the second length L2 and the fourth length L4. In some embodiments, the length of the wick structure 50 proximate the condenser region 30 (i.e., the fourth length L4 in the illustrated four-region embodiment of FIG. 4, but identifiable in wick structures 50 having any other number of wick structure regions in other embodiments) is larger than, at least twice as large, or at least three times as large, as the length of the wick structure 50 proximate the evaporator region (i.e., the first length L1 in the illustrated four-region embodiment of FIG. 4, but again identifiable in wick structures 50 having any other number of wick structure regions in other embodiments).

With continued reference to FIG. 4, the evaporator region 26 has a length $L_e$, the condenser region 30 has a length $L_c$, and an intermediate section 98 (e.g., an adiabatic region) of the heat pipe 10 extending between the evaporator region 26 and the condenser region 30 along the direction 70 has a length $L_a$. A heat flux 102 represents movement of heat into the evaporator region 26 from the heat source 14. A heat flux 106 represents movement of heat out of the condenser region 30.

In the illustrated embodiment of FIG. 4, the length $L_e$ of the evaporator region 26 is approximately equal to, or smaller than, the length L1 of the first region 74, such that all or substantially all of the heat flux 102 into the heat pipe 10 occurs in the first region 74 of the wick structure 50. Alternatively, the length L1 of the first region 74 may be smaller than the length $L_e$ of the evaporator region 26, such that a portion of the heat flux 102 extends into an adjacent region (e.g., second region 78 in the illustrated four-region wick structure embodiment of FIG. 4) of the wick structure 50.

With continued reference to FIG. 4, the length $L_c$ of the condenser region 30 is approximately equal to, or smaller than, the length L4 of the fourth region 86, such that all or substantially all of the heat flux 106 out of the heat pipe 10 occurs in the fourth region 86 of the wick structure 50. Alternatively, the length L4 of the fourth region 86 may be smaller than the length $L_c$ of the condenser region 30, such that a portion of the heat flux 106 extends into an adjacent region (e.g., the third region 78 in the illustrated four-region wick structure embodiment of FIG. 4) of the wick structure 50.

Also with reference to the illustrated embodiment of FIG. 4, the intermediate section 98 includes both the entire second wick structure region 78 and the entire third wick structure region 82. In other embodiments, the intermediate section 98 may include only a portion of the second wick structure region 78 and/or a portion of the third wick structure region 82. The evaporator region 26 may include the first wick structure region 74, the intermediate region 98 may include the second and third wick structure regions 78, 82, and the condenser region 30 may include the fourth wick structure region 86. In yet other embodiments, the wick structure 50 may only have two regions (e.g., a first wick structure region that forms at least part of the evaporator region 26 of the heat pipe 10, and a second wick structure region that forms at least part of the condenser region 30 of the heat pipe 10), may include three wick structure regions, five wick structure regions, six wick structure regions, or even additional wick structure regions. In some embodiments, the evaporator region 26 may include two, three, or more wick structure regions, each wick structure region having particles 62 (or pores, as described herein) of a different size, or otherwise have fluid permeability of different amounts. Similarly, the condenser region 30 may include two, three, or more wick structure regions, each wick structure region having particles 62 (or pores, as described herein) of a different size, or otherwise have fluid permeability of different amounts.

FIGS. 5-9 illustrate further, more specific examples of the heat pipe 10 according to some embodiments of the present invention. For example, and with reference to FIG. 5, the heat pipe 10 may be generally an elongate cylindrical tube having a main body 34 with a thickness of 0.25 mm and having a wick structure 50 with copper powder dendritic particles 62. The illustrated wick structure 50 includes a first wick structure region 74 with a length of 30 mm, a second wick structure region 78 having a length of 180 mm, and a third wick structure region 82 having a length of 90 mm along the direction 70. The first wick structure region 74 is located at the evaporator region 26 of the heat pipe 10, the second wick structure region 78 is located in an intermediate (e.g., adiabatic) region 98 of the heat pipe 10, and the third wick structure region 82 is located in a condenser region 30 of the heat pipe 10. The particles 62 in the first wick structure region 74 are 25-50 µm in diameter, the particles 62 in the second wick structure region 78 are 50-100 µm in diameter, and the particles 62 in the third wick structure region 82 are 100-200 µm in diameter. The heat pipe 10 further includes a vapor space 46 having a diameter of 5.6 mm, and is sealed at both the first and second ends 18, 22.

Other embodiments include various other materials, shapes, dimensions, orientations, and lengths for the wick structure 50 and the vapor space 46. For example, in some embodiments, the diameter of the vapor space 46 is 5.0 mm, or 4.5 mm, or 4.0 mm, or various other values. Also in other embodiments, the length of the first wick structure region 74 may be less than 30 mm, or more than 30 mm. Similarly, and with reference to FIGS. 5 and 7 by way of example only, the lengths of the second and third wick structure regions 78, 82 may also be less than or greater than 180 mm and 90 mm, respectively. In some embodiments, the wick structure 50 includes only two regions, or more than three regions. For example, the wick structure 50 may include a first wick structure region 74 at the evaporator region 26 of the heat pipe 10 and a second wick structure region 78 at the condenser region 30 of the heat pipe 10. The first wick structure region 74 may have a length of, for example 180 mm, and the second wick structure region 78 may have a length of, for example, 100 mm or 90 mm. Additionally, the size of the particles 62 in the various wick structure regions may vary. For example, the particles 62 in the first wick structure region 74 may be smaller or larger than 25-50 µm in diameter (e.g., 50-100 µm, for example), the particles 62 in the second wick structure region 78 may be smaller or larger than 50-100 µm in diameter, and the particles 62 in the third wick structure region 82 may be smaller or larger than 100-200 µm in diameter.

Figure 6:
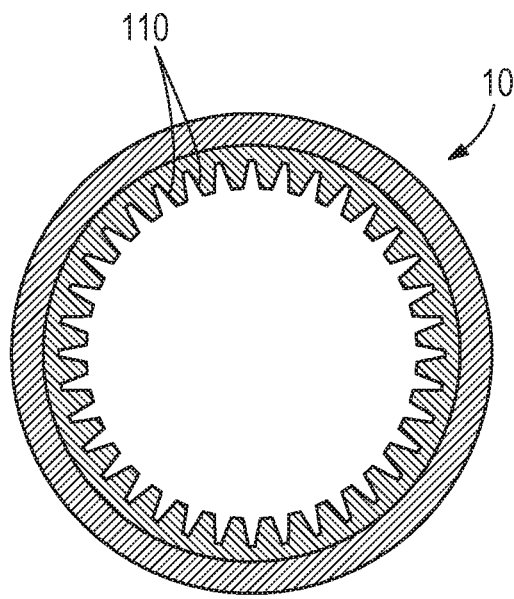
FIG. 6 is a cross-sectional view of the heat pipe of FIG. 5.

With reference to FIG. 6, the wick structure 50 may include (in addition to or in place of particles defining pores for capillary pumping action as described above) grooves 110 that facilitate capillary action. The grooves 110 may each extend parallel to the direction 70. Other embodiments do not include the grooves 110, or include numbers and shapes of grooves that are different than that illustrated.

Figure 7:
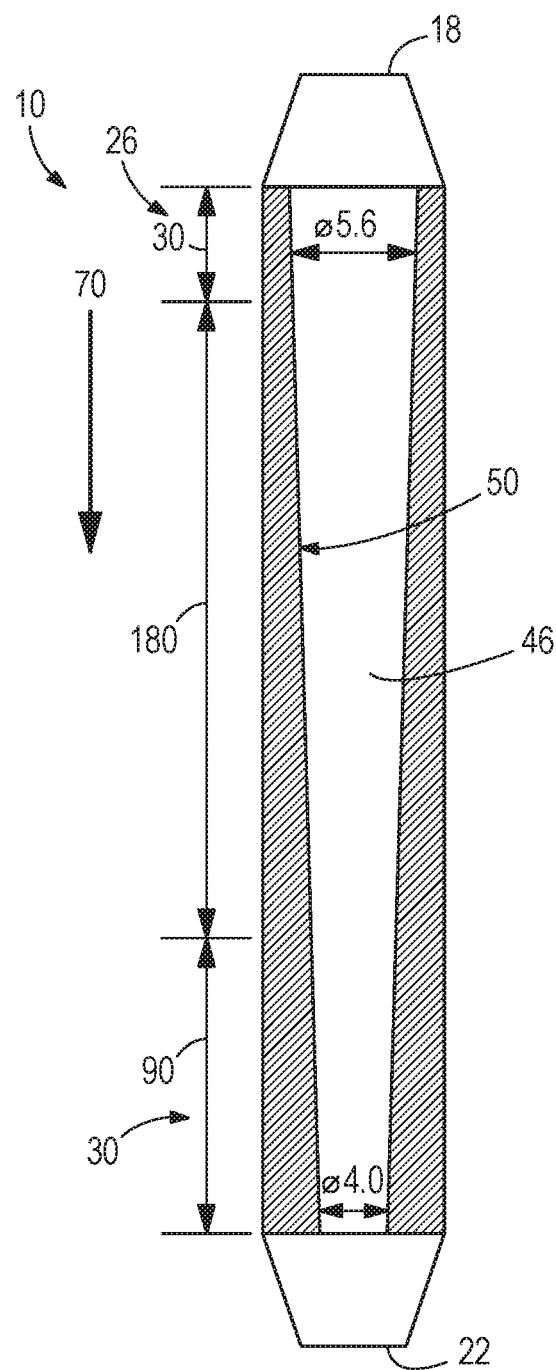
FIG. 7 is a schematic illustration of another embodiment of the heat pipe.

While the wick structures 50 illustrated in FIGS. 1-6 have a generally constant or uniform thickness, in some embodiments the wick structures 50 may have a variable (e.g., tapering) thickness moving along the direction 70. For example, as illustrated in FIG. 7, the wick structure 50 may increase in thickness moving from the evaporator region 26 to the condenser region 30. The tapering thickness of the wick structure 50 results in the vapor space 46 having a larger diameter at the evaporator region 26, and a smaller diameter at the condenser region 30. In yet other embodiments, the wick structure 50 may decrease in thickness toward the condenser region 30, or may increase or decrease in thickness toward the condenser region 30 for only a portion of the wick structure 50, wherein one or more other portions of the wick structure 50 may have a generally constant or uniform thickness.

While the wick structures 50 illustrated in FIGS. 1-7 each extend entirely or substantially entirely from the first end 18 of the heat pipe 10 to the second end 22 of the heat pipe 10, in yet other embodiments the wick structures 50 may not extend entirely to the first end 18 and/or to the second end 22. Additionally, while the illustrated wick structures 50 extend continuously from one wick structure region to the next, in some embodiments multiple wick structures 50 or wick structure regions may be provided within the heat pipe 10, any or all of which can abut or be separated from one another by a gap or gaps along the direction 70.

Figure 8:
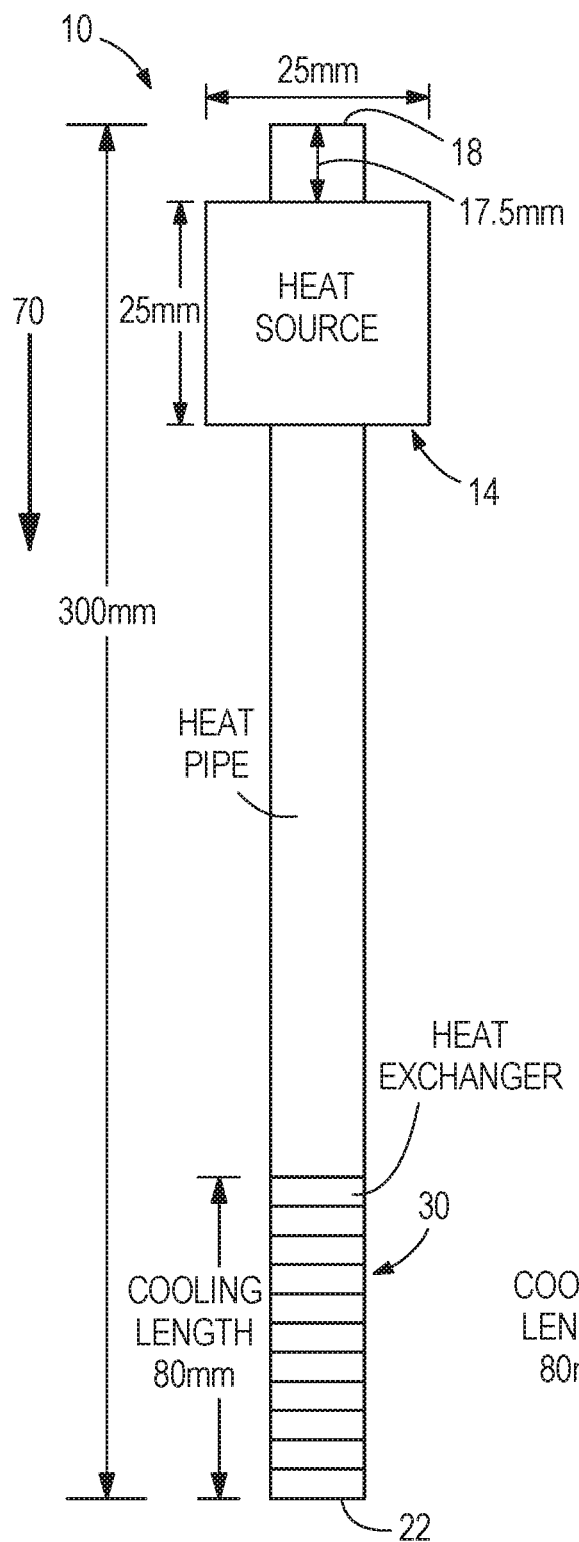
FIGS. 8 and 9 are schematic illustrations of another embodiment of the heat pipe.
Figure 9:
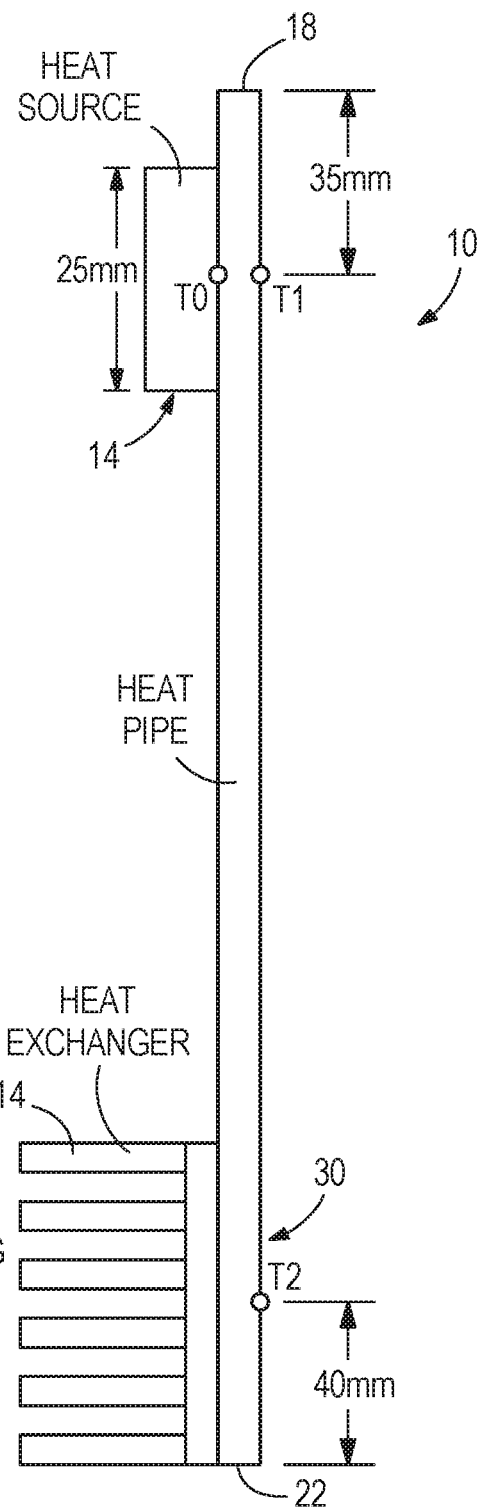

With reference to FIGS. 8 and 9, in some embodiments a portion of the heat pipe 10 may overlap the heat source 14 such that the evaporator region is spaced from the first end 18 of the heat pip 10, and such that heat from the heat source 14 is directed into a region of the wick structure 50 that is spaced from the first end 18. Additionally, as illustrated in FIGS. 8 and 9, a heat exchanger 114 (e.g., set of cooling fins) may be directly or indirectly coupled to the condenser region 30 to facilitate removal of heat from the heat pipe 10. By way of example only, FIGS. 8 and 9 illustrate a heat pipe 10 having an overall length of 300 mm, a heat source 14 having a length and width of 25 mm and spaced from the first end 18 by 17.5 mm, and a heat exchanger 114 having a length of 80 mm. Other embodiments include various other dimensions, sizes, and locations for the heat pipe 10, the heat source 14, and the heat exchanger 114.

With reference to FIGS. 1-9, in some embodiments a temperature of the working fluid varies along the direction 70. For example, the working fluid may be warmer at the evaporator region 26 than at the condenser region 30, and may vary in temperature along the distance between the evaporator region 26 and the condenser region 30. The size of the particles 62 of the first particle size in the first wick structure region 74 (or the pore size in the first wick structure region 74) may thus correspond to a first temperature of the working fluid, the size of the particles 62 of the second particle size in the second wick structure region 78 (or the pore size in the second wick structure region 78) may correspond to a second temperature of the working fluid, the size of the particles 62 of the third particle size in the third wick structure region 82 (or the pore size in the third wick structure region 82) may correspond to a third temperature of the working fluid, and/or the size of the particles 62 of the fourth particle size in the fourth particle region 86 (or the pore size in the fourth wick structure region 86) may correspond to a fourth temperature of the working fluid. The first temperature may be higher than the second temperature, the second temperature may be higher than the third temperature, and/or the third temperature may be higher than the fourth temperature. In some embodiments, one or more of the first, second, third, or fourth temperatures may be the same or similar. For example, in some embodiments, the second and third temperatures may be similar, whereas a significant temperature difference exists between the first and second temperatures and the third and fourth temperatures (e.g., due to heat rapidly entering the particles 62 in the first wick structure region 74 and heat rapidly departing the particles 62 in the fourth wick structure region 86).

In some embodiments, a ratio of evaporated working fluid to condensed working fluid within the heat pipe 10 varies along the direction 70 during operation of the heat pipe 10. For example, the ratio of evaporated working fluid to condensed working fluid at the evaporator region 26 can be higher than a ratio of the evaporated working fluid to condensed working fluid at the condenser region 30 during operation of the heat pipe 10, and may vary along the distance between the evaporator region 26 and the condenser region 30. The size of the particles 62 of the first particle size (or the size of the pores) may thus correspond to a first ratio of evaporated working fluid to condensed working fluid, the size of the particles 62 of the second particle size (or the size of the pores) may correspond to a second ratio of evaporated working fluid to condensed working fluid, the size of the particles 62 of the third particle size (or the size of the pores) may correspond to a third ratio of evaporated working fluid to condensed working fluid, and/or the size of the particles 62 of the fourth particle size (or the size of the pores) may correspond to a fourth ratio of evaporated working fluid to condensed working fluid. The first ratio may be higher than the second ratio, the second ratio may be higher than the third ratio, and/or the third ratio may be higher than the fourth ratio. In some embodiments, one or more of the first, second, third, or fourth ratios may be the same or similar. For example, in some embodiments the second and third ratios may be similar, whereas a significant phase shift exists at the evaporator region 26 and the condenser region 30 (e.g., due to heat rapidly entering the particles 62 in the first wick structure region 74 and heat rapidly departing the particles 62 in the fourth wick structure region 86).

As noted herein, while embodiments herein are described generally in terms of a change in particle size moving along the wick structure 50 and the heat pipe 10, in yet other embodiments the wick structure 50 may instead be seen as having a change in pore size moving along the wick structure and the heat pipe 10. For example, some wick structures 50 may be formed not of individual particles that are pressed, bonded, or otherwise coupled together, but rather of a single material that is worked or otherwise formed to include pores, holes, gaps, openings, or voids (referred to herein as "pores" throughout for ease of description). The pore-filled wick structure 50 may have a first region with pores 66 of a first size, a second region with pores 66 of a second size, etc. The pores of the first region (e.g., a region proximate the evaporator region 26) may be smaller than the pores of another region or regions (e.g., a region proximate the condenser region 30).

Figure 10:
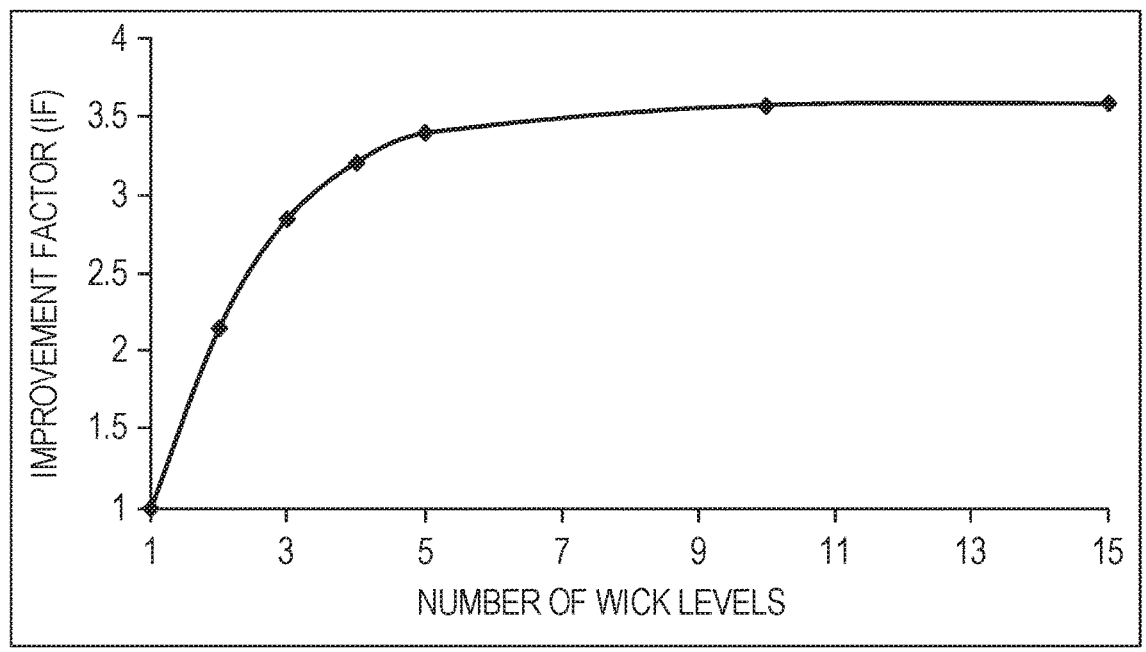
FIG. 10 is a schematic illustration of another embodiment of the heat pipe.

With reference to FIG. 10, it has been discovered that the use of multiple regions of different particle or pore size (or different fluid permeabilities) within the wick structure 50 may improve a capillary limit (i.e., a maximum heat pipe operating power, when a pumping rate is no longer sufficient to provide enough working fluid to the evaporator region 26 due to a sum of the liquid and vapor pressure drops exceeding a maximum capillary pressure that the wick structure 50 can sustain) of the heat pipe 10. In particular, in some embodiments, by increasing the number of regions to two regions, the capillary limit is nearly doubled as compared to a traditional, uniform wick structure having identical particle (or pore) sizes throughout. Also in some embodiments, by increasing the number of regions to three regions, the capillary limit is nearly tripled, whereas by increasing the number of regions to five or more regions, the capillary limit is approximately 3.5 times that of a uniform wick structure 50.

Figure 11:
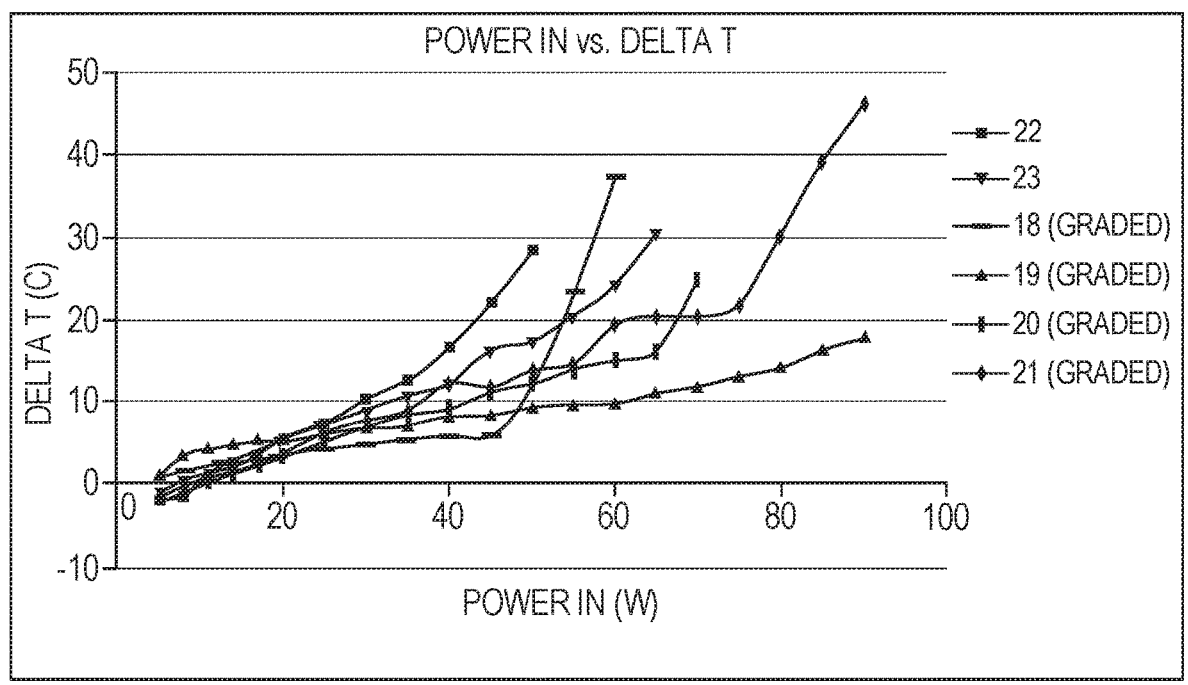
FIG. 11 is a chart illustrating a capillary limit improvement over traditional heat pipes.

With reference to FIG. 11, it has also been discovered that the use of multiple regions of different particle or pore sizes (or different fluid permeabilities) within the wick structure 50 improves the overall performance of the heat pipe. For example, as illustrated in FIG. 11, heat pipes having non-graded wicks (indicated as heat pipes 22 and 23) are much more limited in their capacity to transfer heat at given temperature differentials between the evaporator and condenser regions 26, 30 than heat pipes having graded wicks (indicated as heat pipes 18, 19, 20, and 21).

While generally cylindrical heat pipes 10 and generally cylindrical wick structures 50 have been described and illustrated herein, in some embodiments the heat pipes 10 have other shapes. For example, the heat pipes 10 may have a more cubic (or a substantially cubic) shape, can have a substantially flat shape as described above, and the like. Additionally, while the heat pipes 10 described above are described in terms of having a single evaporator region 26 and a single condenser region 30, in other embodiments the heat pipe 10 may include more than one evaporator region 26 and/or more than one condenser region 30. For example, the heat pipe 10 may include a single, centralized evaporator region 26 that is exposed to a heat source, and the working fluid may move outwardly (e.g., radially) to one or more condenser regions 30, or the evaporator and condenser regions 26, 30 can be reversed in such a structure. As the working fluid moves from the evaporation region 26 to the condenser regions 30, the wick structure 50 disposed therebetween may have various regions such as those described above. As another example, the heat pipe 10 may include an evaporator region 26 on one broad side of a substantially flat heat pipe 10, and a condenser region 30 on an opposite broad side of the substantially flat heat pipe 10. As the working fluid moves from the evaporator region 26 to the condenser region 30, the wick structure 50 disposed therebetween may have various regions such as those described above. In such substantially flat heat pipe embodiments, the wick structure 50 can extend along the short and narrow adjoining sides of the heat pipe. Also or instead, in such substantially flat heat pipe embodiments, the wick structure 50 can be on or define pillars, columns, walls or other elements that are within and surrounded by the vapor space 46 and that extend from one broad side of the heat pipe 10 to the other.

It is to be understood that the present invention is by no means limited only to the particular constructions herein disclosed and shown in the drawings, but also comprises any modifications or equivalents within the scope of the claims.

The invention claimed is:

1. A heat pipe comprising:
   a first end and a second opposite end, wherein the first end defines an evaporator region and the second end defines a condenser region, wherein the heat pipe includes an inner wall that extends from the first end to the second end; and
   a wick structure disposed adjacent the inner wall and extending along a direction from the first end toward the second end, the wick structure including a first wick structure region that extends along the direction, the first wick structure region having wick particles defining a first pore size, the wick structure including a second wick structure region that extends from the first wick structure region along the direction, the second wick structure region having wick particles defining a second pore size that is different from the first pore size, wherein a ratio of the second pore size to the first pore size is at least 1.5:1, and
   wherein the wick structure includes a third wick structure region that extends from the second wick structure region along the direction and has wick particles defining a third pore size that is different from both the first pore size and the second pore size, wherein the first wick structure region has a first length along the direction, the second wick structure region has a second length along the direction, and the third wick structure region has a third length along the direction, wherein the third length is greater than the second length and the second length is greater than the first length.

2. The heat pipe of claim 1, wherein the wick structure extends along the direction continuously from the evaporator region to the condenser region.

3. The heat pipe of claim 1, wherein the heat pipe is an elongated sealed tube, and wherein the wick structure at least partially defines an interior vapor space that extends along the direction from the first end to the second end.

4. The heat pipe of claim 1, wherein the heat pipe includes a hollow body having a flat, non-cylindrical shape and defining an interior vapor space, wherein the wick structure extends between the first and second ends.

5. The heat pipe of claim 1, wherein the first wick structure region is located proximate the evaporator region, and the second wick structure region is located proximate the condenser region.

6. The heat pipe of claim 1, wherein the third pore size is larger than the second pore size.

7. The heat pipe of claim 1, wherein a ratio of the second length to the first length is at least 1.5:1.

8. The heat pipe of claim 1, wherein the wick structure is tapered along at least a portion of both the first and second wick structure regions.

9. The heat pipe of claim 1, wherein substantially every particle in the first wick structure region has a first common size, and substantially every particle in the second wick structure region has a second common size different from the first common size.

10. A heat pipe comprising:
    a hollow body defining an interior vapor space, the hollow body having an evaporator region, a condenser region, and an intermediate region disposed between the evaporator region and the condenser region along a length of the hollow body;
    a wick structure coupled to an inner wall of the hollow body; and
    a working fluid disposed within the hollow body, wherein when heat is applied to the working fluid at the evaporator region the working fluid is configured to evaporate into a vapor state, pass through the interior vapor space in the vapor state, condense back to a liquid state from the vapor state at the condenser region, and return from the condenser region to the evaporator region through the wick structure in the liquid state, such that along the intermediate region the condensed liquid working fluid moves in a direction through the wick structure;
    wherein the wick structure includes a first wick structure region having a first length along the direction and having wick particles defining a first pore size, a second wick structure region having a second length along the direction, the second wick structure region extending from the first wick structure region along the direction, and a third wick structure region having a third length along the direction, the third wick structure region extending from the second wick structure region along the direction, wherein the third length is greater than the second length and the second length is greater than the first length, wherein the second wick structure region has wick particles defining a second pore size that is different from the first pore size, and wherein the third wick structure region has wick particles defining a third pore size that is different from the first pore size and the second pore size.

11. The heat pipe of claim 10, wherein the heat pipe is a sealed tube that is elongated in the first direction.

12. The heat pipe of claim 10, wherein the heat pipe includes a hollow body having a flat, non-cylindrical shape and defining an interior vapor space, the hollow body having a first end that defines the evaporator region and a second opposite end that defines the condenser region, wherein the wick structure extends between the first and second ends.

13. The heat pipe of claim 10, wherein the wick structure is tapered along at least a portion of both the first and second wick structure regions.

14. The heat pipe of claim 10, wherein a ratio of the second length to the first length is at least 1.5:1.

15. The heat pipe of claim 10, wherein substantially every particle in the first wick structure region has a first common size, and substantially every particle in the second wick structure region has a second common size different from the first common size.

16. The heat pipe of claim 10, wherein:
the direction is a first direction;
vapor moves in a second direction within the interior vapor space along the intermediate region; and
the second direction is opposite the first direction.

17. A heat pipe comprising:
a hollow body having a flat, non-cylindrical shape and defining an interior vapor space, the hollow body having a first end that defines an evaporator region and a second opposite end that defines a condenser region;
a working fluid disposed within the hollow body; and
a wick structure extending between the first and second ends of the hollow body, the wick structure lining an inner wall of the hollow body and defining a path for the working fluid in a liquid state between the condenser region and the evaporator region, wherein the wick structure includes a first wick structure region that extends along the path, the first wick structure region having a first fluid permeability, the wick structure including a second wick structure region that extends from the first wick structure region along the path, the second wick structure region having a second fluid permeability that is different from the first fluid permeability, and
wherein the wick structure includes a third wick structure region that extends from the second wick structure region along the path and has a third fluid permeability that is different from both the first fluid permeability and the second fluid permeability, wherein the first wick structure region has a first length along the path, the second wick structure region has a second length along the path, and the third wick structure region has a third length along the path, wherein the third length is greater than the second length and the second length is greater than the first length.

18. The heat pipe of claim 17, wherein the first fluid permeability is lower than the second fluid permeability and the second fluid permeability is lower than the third fluid permeability.

19. The heat pipe of claim 17, wherein a ratio of the second length to the first length is at least 1.5:1.

20. The heat pipe of claim 17, wherein a ratio of the third length to the second length is at least 1.5:1.

21. The heat pipe of claim 17, wherein a ratio of the second length to the first length is at least 1.5:1 and a ratio of the third length to the second length is at least 1.5:1.

22. The heat pipe of claim 17, wherein the wick structure is tapered along at least a portion of both the first and second wick structure regions.

23. The heat pipe of claim 17, wherein the evaporator region has a fourth length along the path that is less than the first length and the condenser region has a fifth length along the path that is less than the third length.

24. The heat pipe of claim 17, wherein the evaporator region has a fourth length along the path that is greater than the first length and the condenser region has a fifth length along the path that is greater than the third length.

25. A heat pipe comprising:
a hollow body defining an interior vapor space, the hollow body having an evaporator region, a condenser region, and an intermediate region disposed between the evaporator region and the condenser region along a length of the hollow body;
a wick structure coupled to an inner wall of the hollow body; and
a working fluid disposed within the hollow body, wherein when heat is applied to the working fluid at the evaporator region the working fluid is configured to evaporate into a vapor state, pass through the interior vapor space in the vapor state in a first direction from the evaporator region to the condenser region, condense back to a liquid state from the vapor state at the condenser region, and return from the condenser region to the evaporator region through the wick structure in the liquid state, such that along the intermediate region the condensed liquid working fluid moves in a second direction through the wick structure,
wherein the wick structure defines a path for the working fluid in the liquid state between the condenser region and the evaporator region, wherein the wick structure includes a first wick structure region that extends along the path, the first wick structure region having a first fluid permeability, the wick structure including a second wick structure region that extends from the first wick structure region along the path, the second wick structure region having a second fluid permeability that is different from the first fluid permeability, and
wherein the wick structure includes a third wick structure region that extends from the second wick structure region along the path and has a third fluid permeability that is different from both the first fluid permeability and the second fluid permeability, wherein the first wick structure region has a first length along the path, the second wick structure region has a second length along the path, and the third wick structure region has a third length along the path, wherein the third length is greater than the second length and the second length is greater than the first length.

26. The heat pipe of claim 25, wherein the evaporator region has a fourth length along the path that is less than the first length and the condenser region has a fifth length along the path that is less than the third length.

27. The heat pipe of claim 25, wherein the evaporator region has a fourth length along the path that is greater than the first length and the condenser region has a fifth length along the path that is greater than the third length.

* * * * *